US008781185B2

(12) United States Patent
Shinoda et al.

(10) Patent No.: US 8,781,185 B2
(45) Date of Patent: Jul. 15, 2014

(54) MAGNETIC RESONANCE IMAGING APPARATUS AND MAGNETIC RESONANCE IMAGING METHOD

(75) Inventors: Kensuke Shinoda, Otawara (JP); Hitoshi Yamagata, Otawara (JP)

(73) Assignees: Kabushiki Kaisha Toshiba, Minato-Ku, Tokyo (JP); Toshiba Medical Systems Corporation, Otawara-Shi, Tochigi-Ken (JP)

( * ) Notice: Subject to any disclaimer, the term of this patent is extended or adjusted under 35 U.S.C. 154(b) by 699 days.

(21) Appl. No.: 12/961,933

(22) Filed: Dec. 7, 2010

(65) Prior Publication Data
US 2011/0140697 A1    Jun. 16, 2011

(30) Foreign Application Priority Data

Dec. 14, 2009 (JP) .................................. 2009-283376
Oct. 20, 2010 (JP) .................................. 2010-235837

(51) Int. Cl.
*G06K 9/00* (2006.01)
*G01R 33/565* (2006.01)
*G01R 33/563* (2006.01)
*G01R 33/567* (2006.01)

(52) U.S. Cl.
CPC ...... *G01R 33/56509* (2013.01); *G01R 33/5635* (2013.01); *G01R 33/5673* (2013.01)
USPC ............................................. 382/128; 378/4

(58) Field of Classification Search
USPC ................. 382/100, 128, 129, 130, 131, 132; 128/922; 378/4–27
See application file for complete search history.

(56) References Cited

U.S. PATENT DOCUMENTS

| | | | | |
|---|---|---|---|---|
| 5,588,431 A | * | 12/1996 | Mani et al. ..................... | 600/410 |
| 5,677,626 A | * | 10/1997 | Miyazaki et al. ............. | 324/307 |
| 5,751,145 A | * | 5/1998 | Shimizu ........................ | 324/309 |
| 7,190,992 B2 | * | 3/2007 | Tatebayashi et al. ......... | 600/410 |
| 7,808,239 B2 | * | 10/2010 | Miyazaki ...................... | 324/309 |
| 2005/0010104 A1 | * | 1/2005 | Fayad et al. ................... | 600/413 |
| 2007/0205769 A1 | * | 9/2007 | Yui et al. ....................... | 324/318 |
| 2008/0136411 A1 | * | 6/2008 | Miyoshi ........................ | 324/309 |
| 2008/0194944 A1 | * | 8/2008 | Edelman ....................... | 600/420 |
| 2008/0265884 A1 | * | 10/2008 | Miyazaki ...................... | 324/309 |

FOREIGN PATENT DOCUMENTS

| | | |
|---|---|---|
| JP | H04-030830 A | 2/1992 |
| JP | 2002-017704 | 1/2002 |
| JP | 2005-058428 A | 3/2005 |
| JP | 2008-289862 | 12/2008 |
| JP | 2009-045251 A | 3/2009 |
| JP | 2009-240669 A | 10/2009 |

OTHER PUBLICATIONS

Japanese Office Action dated Feb. 25, 2014, re counterpart JP 2010-235837.

* cited by examiner

*Primary Examiner* — Anand Bhatnagar
(74) *Attorney, Agent, or Firm* — Nixon & Vanderhye PC

(57) ABSTRACT

According to one embodiment, an MRI apparatus includes an imaging unit and an application region calculating unit. The application region calculating unit automatically calculates an application region of a prepulse according to a region of interest of magnetic resonance imaging based on image data including the region of interest that are acquired before the application of the prepulse. The imaging unit performs magnetic resonance imaging of an object involving the application of the prepulse.

16 Claims, 11 Drawing Sheets

MAGNETIC RESONANCE IMAGING APPARATUS AND MAGNETIC RESONANCE IMAGING METHOD

CROSS-REFERENCE TO RELATED APPLICATION(S)

This application is based upon and claims the benefit of priority from Japanese Patent Application No. 2009-283376, filed on Dec. 14, 2009 and Japanese Patent Application No. 2010-235837, filed on Oct. 20, 2010;

The entire contents of which are incorporated herein by reference.

BACKGROUND

1. Field

Embodiments described herein relate generally to an MRI (magnetic resonance imaging) apparatus and an MRI method.

Additionally, embodiments described herein relate to technology to apply a prepulse such as a presaturation pulse which saturates nuclear spin in an application region and an inversion recovery pulse (hereinafter referred to as an IR pulse).

2. Description of the Related Art

MRI is an imaging method which magnetically excites nuclear spin of an object set in a static magnetic field with an RF (radio frequency) signal having the Larmor frequency and reconstructs an image based on nuclear magnetic resonance signals (hereinafter referred to as MR signals) generated due to the excitation.

An MRI image can include a motion artifact caused by a voluntary or non-voluntary movement of a body tissue. A cyclic movement, such as pulsation of a vessel, can produce a ghost in the image in a certain direction (a phase encoding direction) depending on the imaging condition. A non-cyclic movement, such as swallowing and respiration, can produce parallel stripes in a certain direction (a phase encoding direction) or a blur in the image. These artifacts can be falsely recognized as a lesion and lead to an erroneous diagnosis.

Thus, in normal MRI, in order to improve the image quality, MR signals from a particular region where a motion causing an artifact occurs are suppressed by applying a presaturation pulse to the particular region before application of an excitation pulse for collecting MR signal data.

A known conventional technique using the presaturation pulse is disclosed in Japanese Patent Laid-Open No. 2008-289862. The MRI apparatus described in Japanese Patent Laid-Open No. 2008-289862 displays an application purpose and application efficacy for each prepulse at the time of setting of imaging conditions and determines the order of application in a case where a plurality of prepulses are applied.

The determination of the order of application is made by considering that the presaturation pulse applied last has a greater signal suppressing effect than the other presaturation pulses. This facilitates setting of the plurality of prepulses that have different purposes, such as water excitation and fat suppression.

The invention disclosed in Japanese Patent Laid-Open No. 2008-289862 has good advantages as described above. However, in actual imaging, many imaging conditions other than the order of prepulse application also have to be set. Specifically, an operator has to set not only imaging conditions for the essential region of interest but also imaging conditions for a prepulse intended to reduce an artifact or otherwise improve the image quality. For example, in imaging of a spine, a motion artifact occurs due to a respiratory movement of the abdomen or pulsations of the great cardiac vessel in front of the spine. Thus, an application region for a presaturation pulse to reduce the motion artifact has to be set.

Since the MRI apparatus can separately take images of an artery and a vein by using a labeling technique, such as a time spatial labeling inversion pulse (t-SLIP) method, the MRI is considered effective for diagnosis of a renal artery, for example. However, the imaging conditions are complicated because application regions for a plurality of prepulses including a region-selective IR pulse applied as a labeling pulse and a presaturation pulse have to be considered in combination with positioning for imaging.

Thus, there is a demand for a technique that facilitates setting of an imaging condition concerning a prepulse compared with conventional technique.

DETAILED DESCRIPTION

The following embodiments aim to provide MRI technology to facilitate setting of imaging conditions about a prepulse as compared with the conventional art, but the present invention is not limited to this aim.

According to one embodiment, a magnetic resonance imaging apparatus includes an imaging unit and an application region calculating unit.

The imaging unit performs magnetic resonance imaging of an object involving application of a prepulse. The application region calculating unit automatically calculates an application region of the prepulse according to a region of interest of the magnetic resonance imaging based on image data including the region of interest that are acquired before application of the prepulse.

According to one embodiment, a magnetic resonance imaging method includes the steps of:

(a) automatically calculating an application region of a prepulse according to a region of interest of an object based on image data including the region of interest that are generated by magnetic resonance imaging; and (b) generating image data by performing the magnetic resonance imaging of the object involving application of the prepulse.

A magnetic resonance imaging apparatus and a magnetic resonance imaging method according to embodiments of the present invention will be described with reference to the accompanying drawings.

Note that the same reference numbers are given for identical components in each figure, and overlapping explanation is abbreviated.

First Embodiment

A first embodiment relates to automation of setting of an application region of a presaturation pulse. As an example, imaging of an intervertebral disk of a spine will be described.

Figure 1:
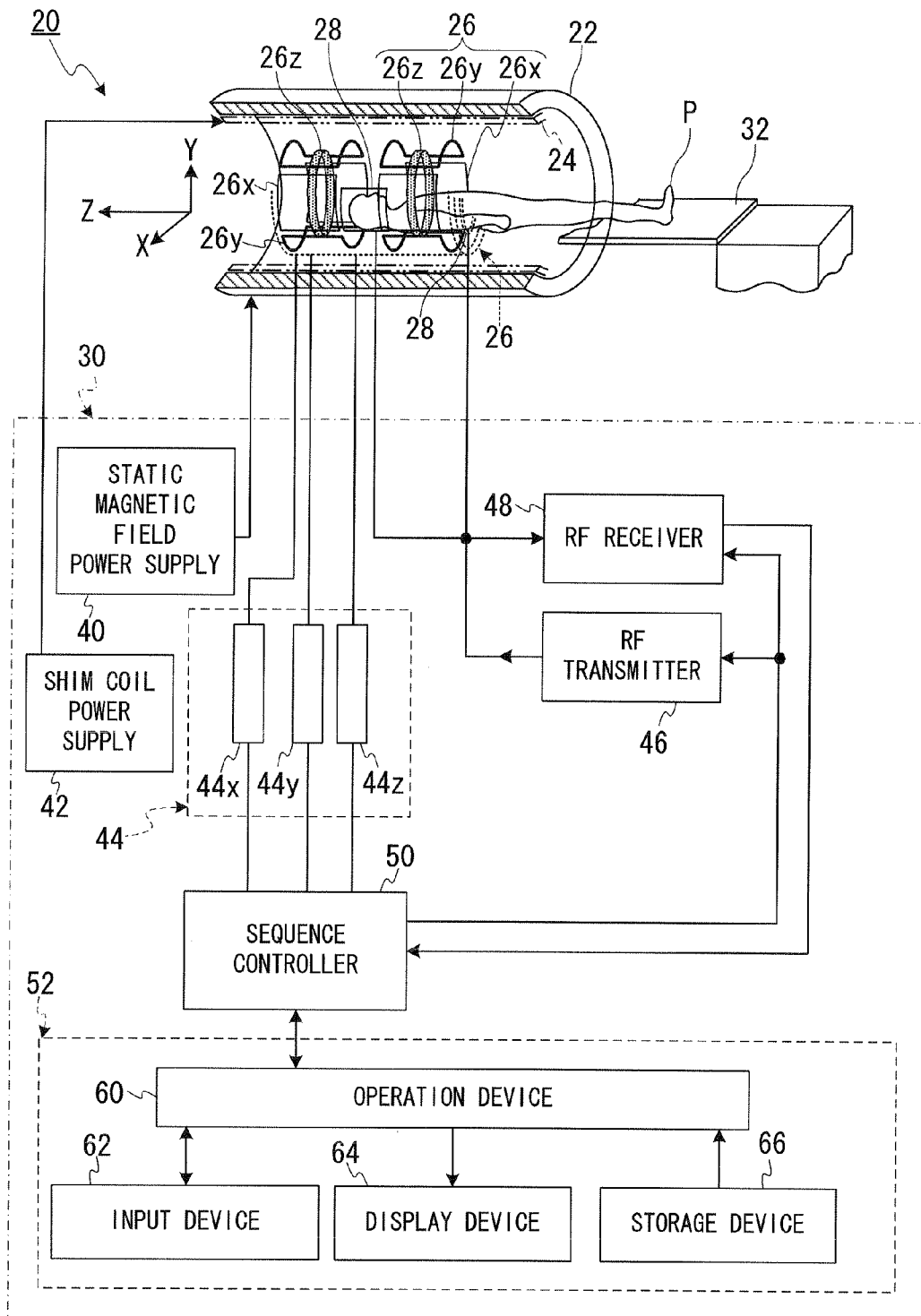
FIG. 1 is a block diagram showing an MRI apparatus according to the first embodiment.

FIG. 1 is a block diagram showing general structure of a magnetic resonance imaging apparatus 20 according to an embodiment of the present invention.

A magnetic resonance imaging apparatus 20 includes a cylinder-shaped static magnetic field magnet 22 for generating a static magnetic field, a cylinder-shaped shim coil 24 arranged inside the static magnetic field magnet 22, a gradient coil 26, RF coils 28, a control system 30, and a bed 32 for placing an object (e.g. a patient) P on it.

As one example, the following description will be made on the assumption that an X axis, a Y axis and a Z axis are perpendicular to each other, and the direction of the Y axis is the same as the vertical direction. In addition, it is assumed that the bed 32 is disposed in such a position that the direction of the table plane thereof on which an object is placed is the same as the X axis direction. Moreover, the direction of an axis of the static magnetic field magnet 22 and the shim coil 24 is aligned with the direction of the Z axis.

The control system 30 includes a static magnetic field power supply 40, a shim coil power supply 42, a gradient magnetic field power supply 44, an RF transmitter 46, an RF receiver 48, a sequence controller 50 and a computer 52.

The gradient magnetic field power supply 44 includes an X-axis gradient magnetic field power supply 44x, a Y-axis gradient magnetic field power supply 44y and a Z-axis gradient magnetic field power supply 44z.

The computer 52 includes an operation device 60, an input device 62, a display device 64, and a storage device 66.

The static magnetic field magnet 22 is electrically connected to the static magnetic field power supply 40 and has a function to generate a static magnetic field in an imaging space by using electric current supplied from the static magnetic field power supply 40.

The shim coil 24 is electrically connected to the shim coil power supply 42 and uniforms the static magnetic field with the electric current supplied from the shim coil power supply 42.

The static magnetic field magnet 22 includes a superconductivity coil in many cases. The static magnetic field magnet 22 gets electric current from the static magnetic field power supply 40 at excitation. However, once excitation has been made, the static magnetic field magnet 22 is usually isolated from the static magnetic field power supply 40. The static magnetic field magnet 22 may include a permanent magnet which makes the static magnetic field power supply 40 unnecessary.

The gradient coil 26 includes an X-axis gradient coil 26x, a Y-axis gradient coil 26y and a Z-axis gradient coil 26z. Each of the X-axis gradient coil 26x, the Y-axis gradient coil 26y and the Z-axis gradient coil 26z is cylinder-shaped and arranged inside the static magnetic field magnet 22.

The X-axis gradient coil 26x, the Y-axis gradient coil 26y and the Z-axis gradient coil 26z are electrically connected to the X-axis gradient magnetic field power supply 44x, the Y-axis gradient magnetic field power supply 44y and the Z-axis gradient magnetic field power supply 44z of the gradient magnetic field power supply 44 respectively.

The X-axis gradient magnetic field power supply 44x, the Y-axis gradient magnetic field power supply 44y and the Z-axis gradient magnetic field power supply 44z supply electric current to the X-axis gradient coil 26x, the Y-axis gradient coil 26y and the Z-axis gradient coil 26z respectively so as to generate a gradient magnetic field Gx in the X-axis direction, a gradient magnetic field Gy in the Y-axis direction and a gradient magnetic field Gz in the Z-axis direction in the imaging space.

The RF transmitter 46 generates RF pulses in accordance with control information provided from the sequence controller 50, and outputs the generated RF pulses to the transmission RF coil 28.

The RF coils 28 include a WBC (whole body coil) built in the gantry for transmission and reception of RF pulses and local coils arranged around the bed 32 or the object P for reception of RF pulses.

The transmission RF coil 28 transmits an RF pulse given from the RF transmitter 46 to the object P. The reception RF coil 28 receives an MR signal generated due to excited nuclear spin inside the object P by the RF pulse and this MR signal is detected by the RF receiver 48.

The RF receiver 48 generates raw data which are digitized complex number data obtained by performing predetermined signal processing and A/D (analogue to digital) conversion to the detected MR signal, and inputs the generated raw data to the sequence controller 50.

The operation device 60 performs system control of the magnetic resonance imaging apparatus 20 in imaging operation, and details of the operation device 60 will be explained later with reference to FIG. 2.

The sequence controller 50 stores control information needed in order to make the gradient magnetic field power supply 44, the RF transmitter 46 and the RF receiver 48 drive. The aforementioned control information includes, for example, sequence information describing operation control information such as intensity, impression period and impression timing of the pulse electric current which should be impressed to the gradient magnetic field power supply 44.

The sequence controller 50 generates the gradient magnetic fields Gx, Gy and Gz in the X-axis, Y-axis and Z-axis directions and RF pulses by driving the gradient magnetic field power supply 44, the RF transmitter 46 and the RF receiver 48 according to a predetermined sequence stored. Additionally, the sequence controller 50 receives raw data of an MR signal inputted from the RF receiver 48, and input the raw data to the operation device 60.

Figure 2:
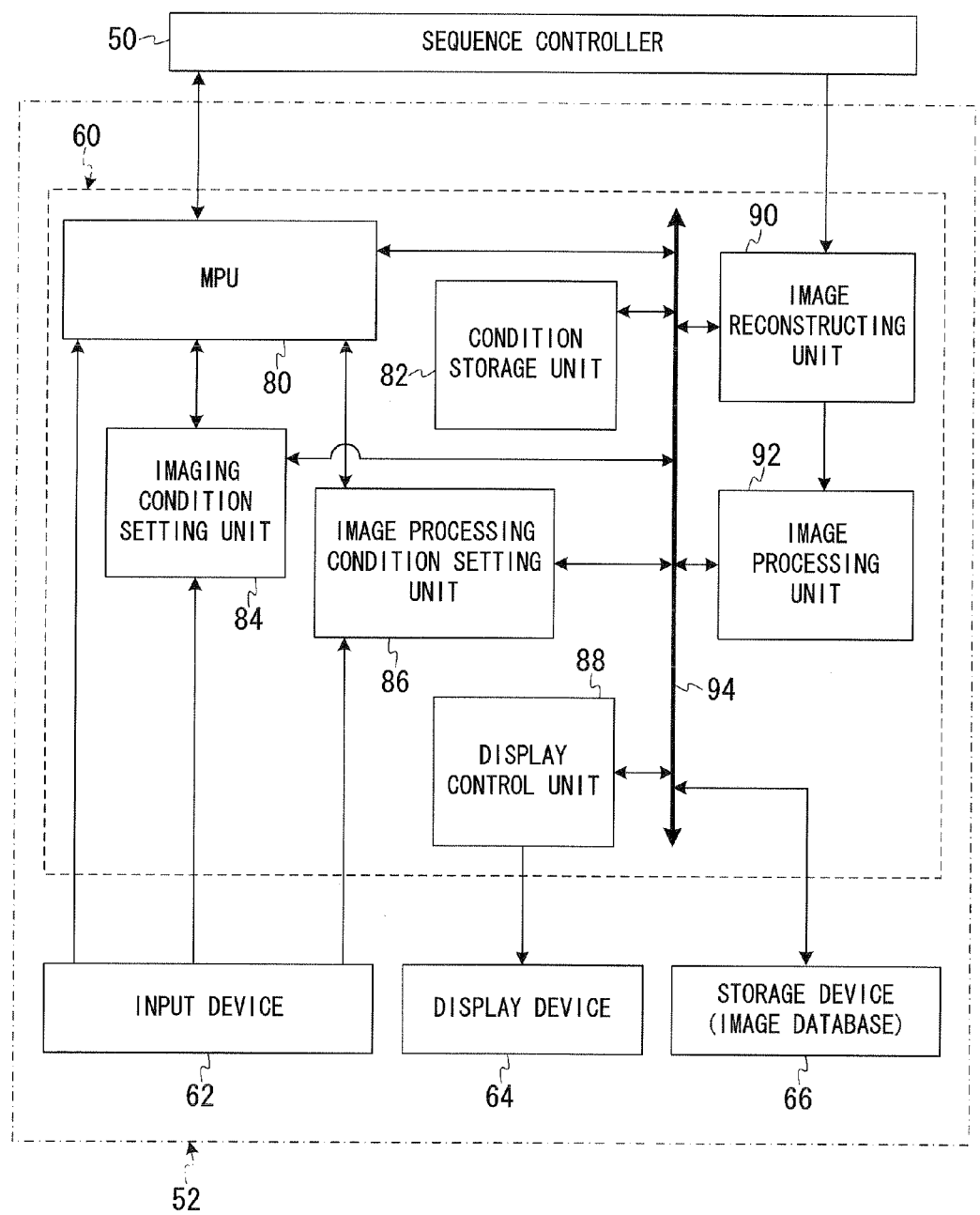
FIG. 2 is a functional block diagram showing details of the computer 52 (especially the operation device 60) shown in FIG. 1.

FIG. 2 is a functional block diagram showing details of the computer 52 and, in particular, the operation device 60 shown in FIG. 1. As shown in FIG. 2, the operation device 60 includes a micro processor unit (MPU) 80, a condition storage unit 82, an imaging condition setting unit 84, an image processing condition setting unit 86, a display control unit 88, an image reconstructing unit 90, an image processing unit 92, and a system bus 94.

The MPU 80 performs system control for the whole of an MRI apparatus 20 via the system bus 94 in setting of an imaging condition, in an imaging operation, and in image processing after imaging.

The input device 62 provides to an operator a function of setting imaging conditions or image processing conditions. Once the imaging conditions are set, the input device 62 is used by the operator to input a control command to start imaging or stop imaging to the MPU 80.

The condition storage unit 82 stores the imaging conditions and the image processing conditions.

The imaging condition setting unit 84 acquires imaging conditions for previous imaging from condition storage unit 82 via system bus 94 and receives imaging conditions set by the operator via input device 62. In addition, imaging condition setting unit 84 stores imaging conditions modified based on input by the operator in condition storage unit 82. In addition, imaging condition setting unit 84 performs prepulse region calculation processing based on a result of region extraction processing performed by image processing unit 92 described later. This is one of the significant characteristics of this embodiment and determines an application region of a presaturation pulse. The region extraction processing and the prepulse region calculation processing described above will be described later in detail with reference to FIG. 8 and the following drawings.

The image processing condition setting unit 86 acquires previous image processing conditions from the condition storage unit 82 via the system bus 94 and receives image processing conditions set by the operator via the input device 62. In addition, the image processing condition setting unit 86 stores an image processing condition inputted and set by the operator in the condition storage unit 82.

The image reconstructing unit 90 performs processing, such as a known two-dimensional Fourier transform, on raw data of an MR signal inputted from the sequence controller 50 to generate image data for an MR image of each slice of an object P. The image reconstructing unit 90 inputs the generated image data to the image processing unit 92.

The image processing unit 92 performs image processing on the inputted image data under the image processing conditions stored in condition storage unit 82 and stores the resulting processed image data in storage device 66.

In addition, based on image data acquired by taking a pilot image (scout image) or the like, image processing unit 92 performs region extraction processing to extract a region of a particular tissue in the body of object P, such as an organ and the backbone. This is also one of the significant characteristics of this embodiment.

The storage device 66 functions as an image database and stores image data processed by image processing unit 92 after being generated by image reconstructing unit 90 and imaging conditions under which its MR image is acquired and relevant patient information in association with each other. In addition, storage device 66 transmits the image data to image processing unit 92 and display control unit 88 in response to a command from MPU 80.

The display control unit 88 makes the display device 64 display the imaging conditions and the image processing conditions stored in the condition storage unit 82 and display the image data stored in the storage device 66 as an MR image. In addition, if the imaging conditions or the image processing conditions stored in the condition storage unit 82 are modified, the display control unit 88 makes the display device 64 display the latest imaging conditions or image processing conditions.

Figure 3:
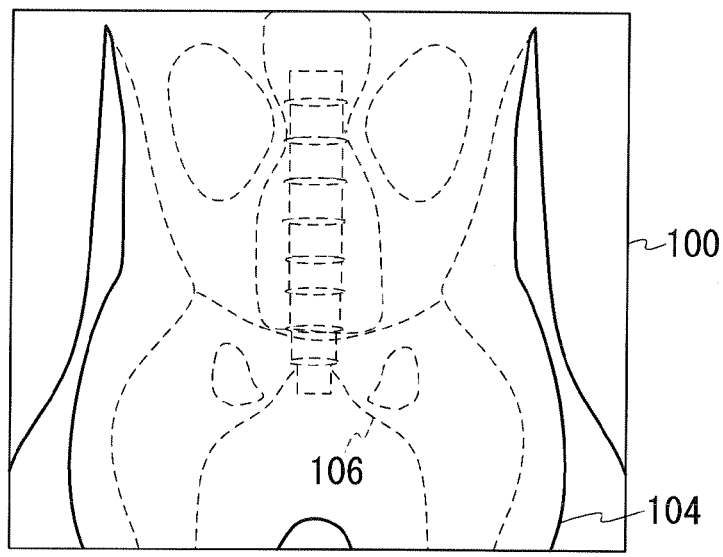
FIG. 3 is a schematic diagram showing a coronal cross-section image that is an example of the pilot image used in imaging of a spine.
Figure 4:
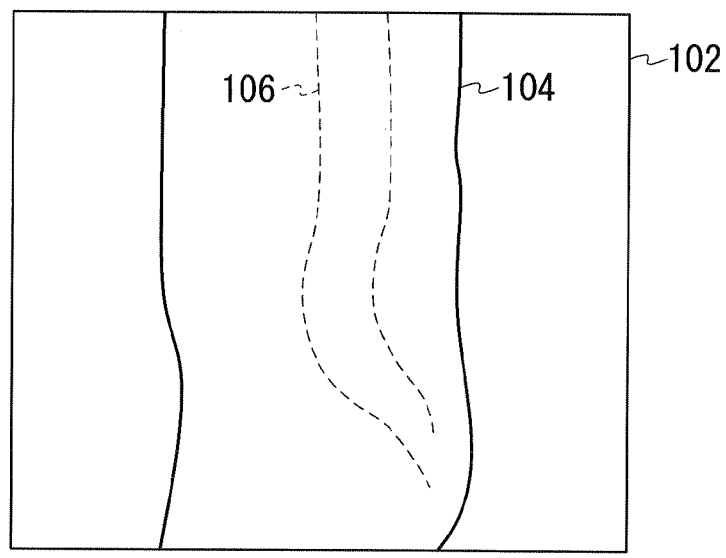
FIG. 4 is a schematic diagram showing a sagittal cross-section image that is an example of the pilot image used in imaging of the spine.

FIG. 3 is a schematic diagram showing a cross-sectional image in a coronal plane that is an example of the pilot image used in imaging of a spine, and FIG. 4 is a schematic diagram showing a cross-sectional image in a sagittal plane that is an example of the pilot image used in imaging of the spine. In FIGS. 3 and 4, the outermost rectangular frame represents an outer periphery 100, 102 of an imaging slice including a region of interest, the solid line in the frame represents a body surface boundary 104 of the object P, and the dotted line represents a contour 106 of a body tissue of the object P.

Figure 5:
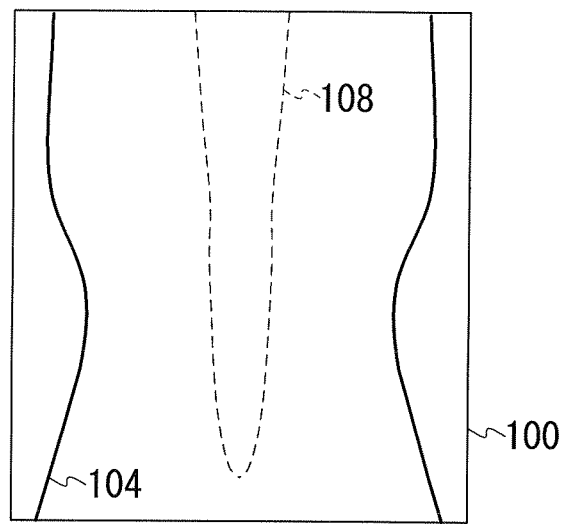
FIG. 5 is a schematic diagram showing a coronal cross-section image that is an example of boundary information for the spine and the body surface.
Figure 6:
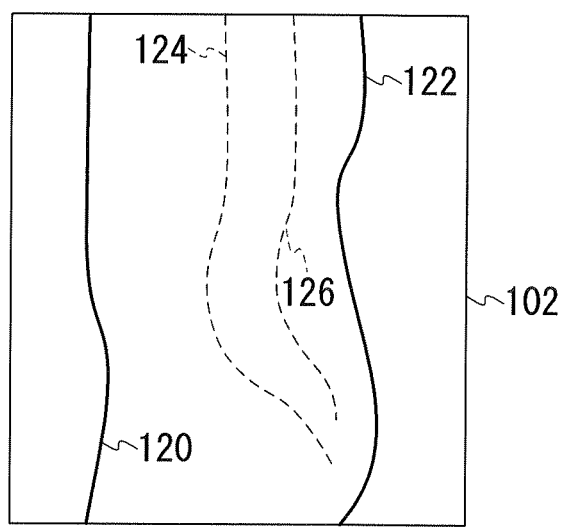
FIG. 6 is a schematic diagram showing a sagittal cross-section image that is an example of the boundary information for the spine and the body surface.

FIG. 5 is a schematic diagram showing a coronal cross-sectional image that is an example of boundary information for the spine and the body surface, and FIG. 6 is a schematic diagram showing a sagittal cross-sectional image that is an example of the boundary information for the spine and the body surface.

In FIG. 5, the solid line represents a body surface boundary 104 of the object P, and the dotted line represents a contour 108 of the backbone. In FIG. 6, the solid line represents a ventral body surface boundary 120 and a dorsal body surface boundary 122, and the dotted line represents a ventral spine boundary 124 and a dorsal spine boundary 126.

Figure 7:
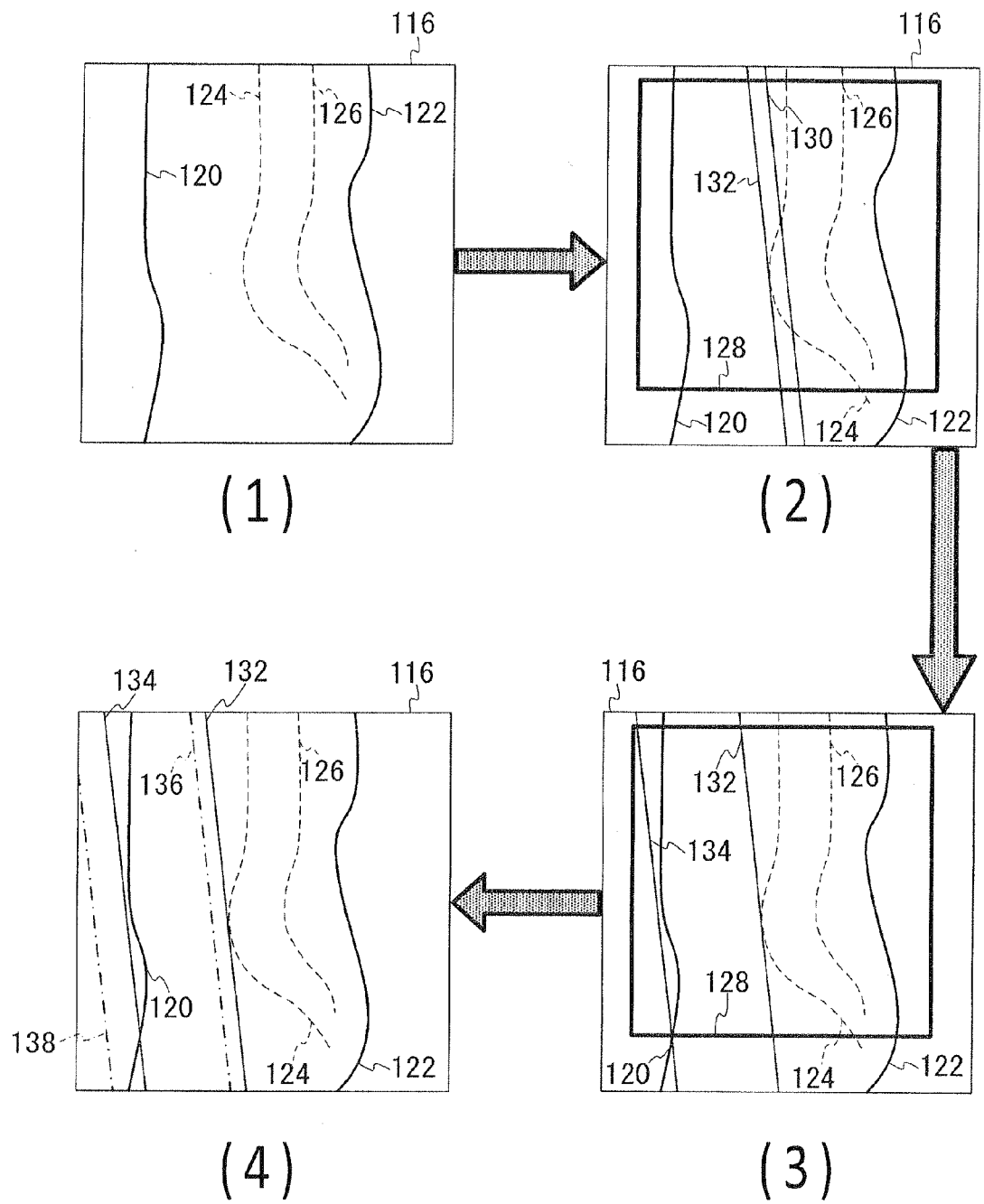
FIG. 7 is a schematic diagram illustrating a process of determining an application region of a presaturation pulse.

FIG. 7 includes schematic diagrams showing sagittal cross-sectional images for illustrating a process of determining an application region of a presaturation pulse, which are assigned numbers (1) to (4) according to the time sequence in the determination process.

FIG. 7, (1), shows a sagittal cross-sectional image after the boundaries of the spine and the body surface are extracted. FIG. 7 (2) shows a sagittal cross-sectional image after the direction of the application region of a presaturation pulse (hereinafter referred to as presaturation pulse application region is determined. FIG. 7, (3), shows a sagittal cross-sectional image after a straight line 134 tangent to ventral body surface boundary 120 is determined. FIG. 7, (4), shows a sagittal cross-sectional image after the thickness of the presaturation pulse application region is determined.

In FIG. 7, (1) to (4), the outermost rectangular frame represents an outer periphery 116 of the pilot image displayed on display device 64. In FIG. 7, (2) and (3), the rectangular frame indicated by the bold solid line represents an outer periphery 128 of a (positioned) imaging slice including a region of interest.

In FIG. 7, (4), for clarity of other elements, outer periphery 128 is not shown. Meanings of straight lines denoted by reference numerals 130, 132, 134, 136 and 138 in FIG. 7, (2) to (4) will be described next with reference to FIG. 8 in connection with an operation of MRI apparatus 20.

Figure 8:
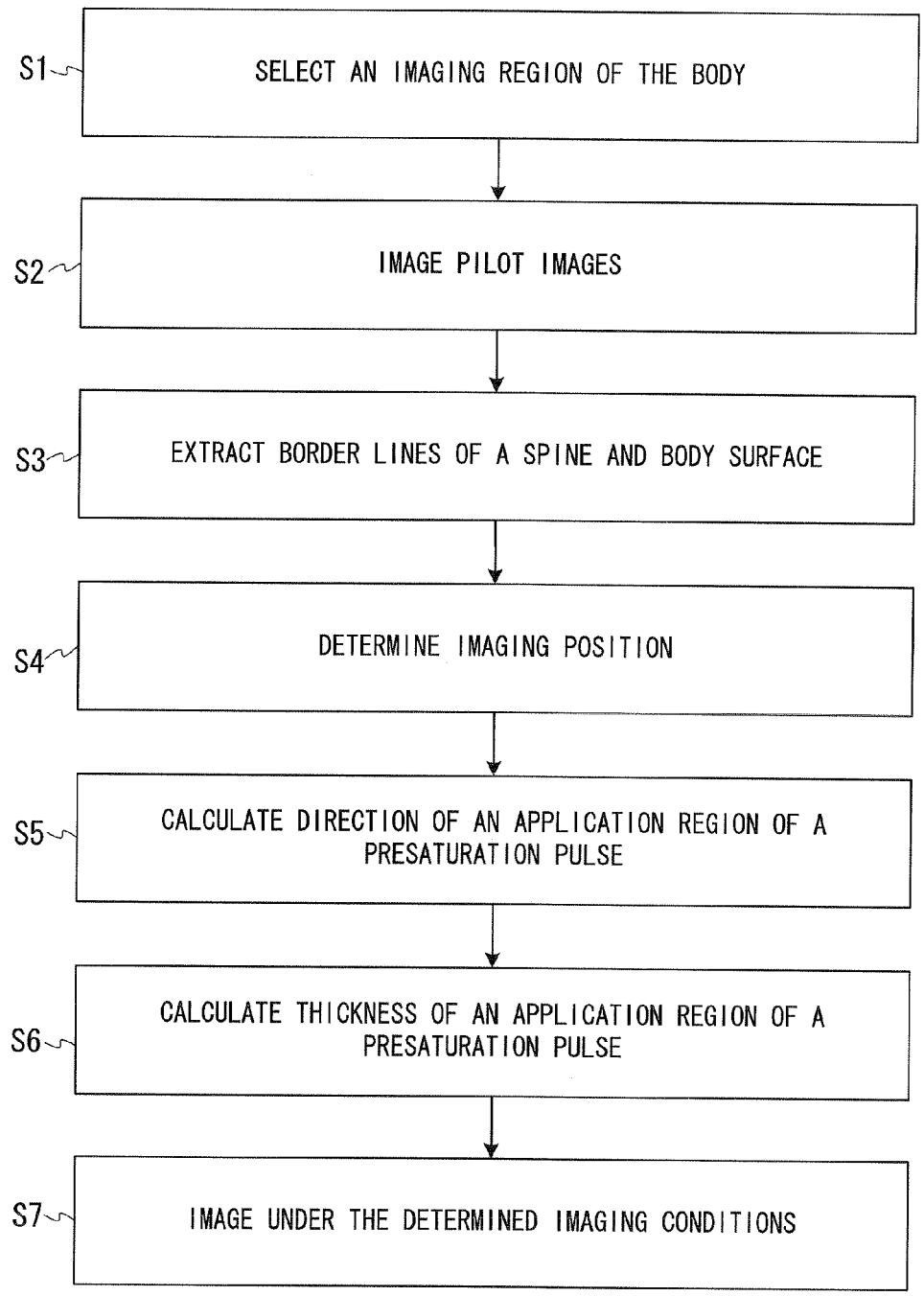
FIG. 8 is a flowchart illustrating an operation of the MRI apparatus 20 according to the first embodiment.

FIG. 8 is a flowchart illustrating an operation of the MRI apparatus 20 according to the first embodiment. In the following, an operation of the MRI apparatus 20 will be described with reference to the flowchart of FIG. 8 and FIGS. 1, 2 and 5 to 7 if necessary.

[Step S1]

The operator specifies an imaging target (purpose) via input device 62 (see FIG. 1). In this embodiment, imaging of an intervertebral disk of a spine is specified, for example.

The imaging condition setting unit 84 (see FIG. 2) stores an imaging condition spine in condition storage unit 82, acquires imaging conditions previously used for imaging of an intervertebral disk of a spine from condition storage unit 82, and inputs the acquired imaging condition to display control unit 88. The display control unit 88 makes display device 64 display examples of the imaging conditions previously used for imaging of an intervertebral disk of a spine.

The operator can edit the imaging condition referring to the display content. However, if no input occurs, the imaging condition setting unit 84 makes settings to take coronal cross-sectional images and sagittal cross-sectional images as MR images used for positioning of imaging slices (referred to as a pilot image hereinafter). This is because imaging of an intervertebral disk of a spine is specified as an imaging target in this embodiment, and the coronal cross-sectional image and the sagittal cross-sectional image are generally more suitable for positioning than an axial cross-sectional image (a traverse cross-sectional image).

[Step S2]

When the operator instructs to start imaging via the input device 62, the MRI apparatus 20 takes pilot images. Then, the sequence controller 50 inputs raw data of the MR signal to the image reconstructing unit 90, and the image reconstructing unit 90 performs a processing, such as two-dimensional Fourier transform, on the raw data to generate image data for the pilot images, and inputs the image data to the image processing unit 92. The image processing unit 92 performs a predetermined image processing on the inputted image data under the image processing conditions stored in the condition storage unit 82 and stores the processed image data in the storage device 66.

[Step S3]

The image processing unit 92 acquires the image data for the pilot images from storage device 66 and performs region extraction processing to extract positions of the boundaries of the spine and the body surface based on the image data.

More specifically, image processing unit 92 performs noise removal processing, such as processing using a median filter or erosion, on the image data for the coronal cross-sectional images and the sagittal cross-sectional images generated in Step S2.

Then, the image processing unit 92 performs threshold processing on the image data from which noise has been removed, thereby extracting an air part and a spine part to produce a mask image. In general, since air and bones contain little water and thus relatively few hydrogen atoms, the air region and the bone region in an MR image are low-signal regions (which appear black in the MR image), and therefore can be distinguished from the regions of adjacent other tissues.

Then, the image processing unit 92 creates air mask images by regarding a low-signal part (a black region) adjacent to the outer periphery of the image as an air region.

The image processing unit 92 also creates spine mask images by regarding a low-signal part other than the air region as a spine region.

Then, the image processing unit 92 performs edge extraction processing using a differential filter on the image data of the pilot images.

The image processing unit 92 extracts the boundary position of the spine by combining the result of edge extraction and air mask images and spine mask images described above (see FIGS. 5 and 6).

In addition, the image processing unit 92 acquires outer peripheries of the air mask images as boundaries between air and a body tissue, that is, the boundaries of the body surface.

The image processing unit 92 stores the boundary information for the spine and the body surface extracted as described above and inputs the boundary information to the imaging condition setting unit 84.

In addition, for positioning of axial cross-sectional images, image processing unit 92 performs a segmentation processing of sorting out between vertebras and intervertebral disks based on the image data for the coronal cross-sectional images and the sagittal cross-sectional images.

The sort-out segmentation can be prior-art image processing, such as template matching of the acquired image with a standard human skeleton model representing the shape, the size and the like of the vertebras and intervertebral disks.

The image processing unit 92 stores the boundary information for the vertebras and the intervertebral disks sorted out and segmented in this way and inputs the boundary information to imaging condition setting unit 84.

[Step S4]

The imaging condition setting unit 84 performs positioning for the main scan imaging. An imaging region for the sagittal cross section of the spine is positioned so that the field of view (FOV) is perpendicular to the pilot image of the coronal cross section.

A phase encoding direction of the imaging region for the sagittal cross section of the spine is set to be parallel to the direction of extension of the spine extracted from the pilot image of the coronal cross section, and the foot-to-head direction is assumed to be a positive direction.

In addition, the imaging condition setting unit 84 refers to the spine region extracted from the pilot image of the sagittal cross section, and sets the FOV by adding a margin set as an image processing condition so that the FOV covers the spine region. In order to take an image of the sagittal cross section passing through the center of the spine, the imaging condition setting unit 84 makes settings to produce a plurality of slices of images so that a center of an imaging slice passes through the center of the extracted spine region.

In addition, in order to take a cross-sectional image of each intervertebral disk, the imaging condition setting unit 84 performs positioning of an axial cross-sectional image of each intervertebral disk based on the boundary information for the vertebras and the intervertebral disks acquired in Step S3 so that the center of the imaging slice agrees with the center of the intervertebral disk. And sets the imaging condition setting unit 84 sets the number of slices at 3, for example.

The imaging condition settings described above are stored in the condition storage unit 82 and displayed on the display device 64 under the control of the display control unit 88. The operator can also manually adjust the imaging condition settings via the input device 62 as required.

[Step S5]

In steps S5 and S6, the imaging condition setting unit 84 performs the prepulse region calculating processing. In step S5, a direction of the presaturation pulse application region is calculated. Then, in step S6, the thickness of the presaturation pulse application region is calculated. The presaturation pulse applied in imaging of the spine is intended to reduce a motion artifact in the abdomen.

More specifically, the imaging condition setting unit 84 distinguishes between the ventral side and the dorsal side in the sagittal cross-sectional image based on the boundary information for the spine and the body surface in the sagittal cross-sectional image acquired in Step S3 and information about the body orientation with respect to the MR image.

The imaging condition setting unit 84 thereby determines which of the two body surface boundaries is the ventral body surface boundary 120 (or the dorsal body surface boundary 122). Similarly, the imaging condition setting unit 84 determines the ventral spine boundary 124 and the dorsal spine boundary 126 (see FIG. 7(1)). In general, the information about the body orientation with respect to the MR image can be acquired from the condition storage unit 82, because the information is an imaging condition inputted when each MR image is taken.

Then, as shown in FIG. 7(2), the imaging condition setting unit 84 calculates a straight line 130, which is a linear approximation of the ventral spine boundary 124 inside the outer periphery 128 of the imaging slice.

The linear approximation can be made by a known process, such as a process of applying the least squares method after replacing the ventral spine boundary 124 with a large number of plots in a two-dimensional coordinate system.

A part of the ventral spine boundary 124 that protrudes beyond the outer periphery 128 of the imaging slice is not considered in the calculation of the straight line 130. The imaging condition setting unit 84 provisionally determines the direction of the straight line 130 as the direction of the presaturation pulse application region.

[Step S6]

In order to calculate the thickness of the presaturation pulse application region, as shown in FIG. 7(2), the imaging condition setting unit 84 calculates a straight line 132 that is parallel to the straight line 130 and is tangential to the ventral spine boundary 124 in the range of the imaging slice from the ventral side.

Then, as shown in FIG. 7(3), the imaging condition setting unit 84 calculates a straight line 134 that is parallel to the straight line 132 and is tangent to the ventral body surface boundary 120 inside the outer periphery 128 of the imaging slice from outside the abdomen. A part of the ventral body surface boundary 120 that protrudes beyond the outer periphery 128 of the imaging slice is not considered in the calculation of the straight line 134.

Then, as shown in FIG. 7(4), the imaging condition setting unit 84 calculates a straight line 136 (shown by an alternate long and short dash line in the drawing) that is translated from the straight line 132 to the ventral side by a margin (a distance from the spine boundary to an edge of the presaturation pulse application region) set as one of the image processing conditions.

As the margin, an appropriate value (10 mm, 20 mm, or a third of the width of the spine, for example) can be set in advance by considering the following two points. First, if the margin is too small, even a slight motion of the object P may result in suppression of an MR signal from the spine region, which is a region of interest, by the presaturation pulse. Second, if the margin is too large, the effect of suppressing the motion artifact in the region other than the region of interest is reduced.

Then, as shown in FIG. 7(4), the imaging condition setting unit 84 calculates a straight line 138 (shown by an alternate long and short dash line in the drawing) that is translated from the straight line 134 outwardly from the abdomen (that is, toward the outer periphery 128 of the imaging slice) by a margin set as one of the image processing conditions. The margin corresponds to the width from an edge of the presaturation pulse application region to the ventral body surface boundary 120.

The distance between the straight line 136 and the straight line 138 is the thickness of the presaturation pulse thickness application region. That is, the imaging condition setting unit 84 provisionally determines the region between the straight lines 136 and 138 as the presaturation pulse application region and stores the application region in the condition storage unit 82 as an imaging condition. The presaturation pulse application region automatically calculated in this way is displayed on the display device 64 under the control of the display control unit 88 as shown in FIG. 7(4), for example.

The operator can modify (adjust) the direction or width of the displayed presaturation pulse application region via the input device 62 as required. If the operator does not perform any input operation for the presaturation pulse application region, the imaging condition setting unit 84 determines the application region automatically calculated (provisionally determined) as described above as a definitive presaturation pulse application region.

The presaturation pulse application region automatically calculated as described above may be automatically determined as a definitive application region without displaying the automatically determined application region to allow the operator to confirm the application region.

[Step S7]

Imaging is performed under the imaging conditions finally determined as described above. More specifically, a presaturation pulse is applied to the region between the straight lines 136 and 138, an RF pulse or the like for acquiring image data is applied, and an MR signal from the object P is detected by an RF receiver 48.

The sequence controller 50 inputs raw data of the MR signal to image reconstructing unit 90, and the image reconstructing unit 90 performs predetermined processing on raw data to generate image data and inputs image data to image processing unit 92.

The image processing unit 92 performs predetermined image processing on the inputted image data and stores the processed image data in storage device 66. In addition, the processed image data is displayed on display device 64 under control of display control unit 88.

The foregoing is a description of an operation of the MRI apparatus 20 according to the first embodiment.

As described above, according to the first embodiment, the MRI apparatus 20 automatically calculates the imaging condition concerning the application region for the presaturation pulse for reducing a motion artifact or a flow artifact. Therefore, the burden of setting imaging conditions on the operator is reduced. As a result, the throughput of examination using the MRI apparatus 20 can be improved.

Second Embodiment

A second embodiment is the same as the first embodiment in that the presaturation pulse application region in imaging of an intervertebral disk of a spine is automatically calculated, but differs from the first embodiment in the following point.

That is, according to the second embodiment, the straight lines 136 and 138 (corresponding to edges of the presaturation pulse application region) are calculated for image data for each time phase acquired by dynamic imaging (an imaging method that involves taking a plurality of images for each cross section at different time phases) in the same manner as in the first embodiment. Then, the region between the straight lines 136 and 138 for the image data for a time phase in which the distance between the straight lines 136 and 138 (corresponding to the thickness of the presaturation pulse application region) is at a maximum is (provisionally) determined as the presaturation pulse application region.

The configuration of an MRI apparatus according to the second embodiment is the same as the configuration of the MRI apparatus 20 according to the first embodiment shown in FIGS. 1 and 2. Therefore, the diagram showing the configuration of the apparatus is omitted, and the MRI apparatus according to the second embodiment is denoted by the same reference numeral 20 as in the first embodiment.

Figure 9:
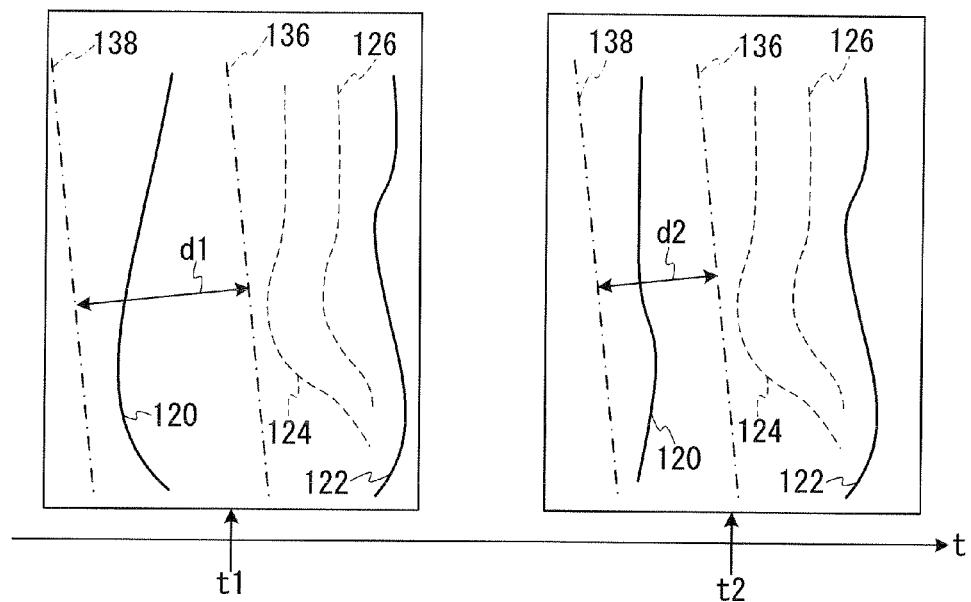
FIG. 9 is a schematic diagram showing the thickness of an application region of a presaturation pulse for sagittal cross-sectional images taken at different respiratory phases in dynamic imaging in the second embodiment.

FIG. 9 is a schematic diagram showing the straight lines 136 and 138 determined in the same manner as in the first embodiment for sagittal cross-sectional images taken at different respiratory phases in dynamic imaging. In the drawing, an abscissa indicates an elapsed time t.

In this example, at a time t1, the thickness of the abdomen is at a maximum, and therefore, the distance between the straight lines 136 and 138 that corresponds to the thickness of the presaturation pulse application region is at a maximum (d1). And at a time t2, the distance between the straight lines 136 and 138 is at a minimum (d2).

Figure 10:
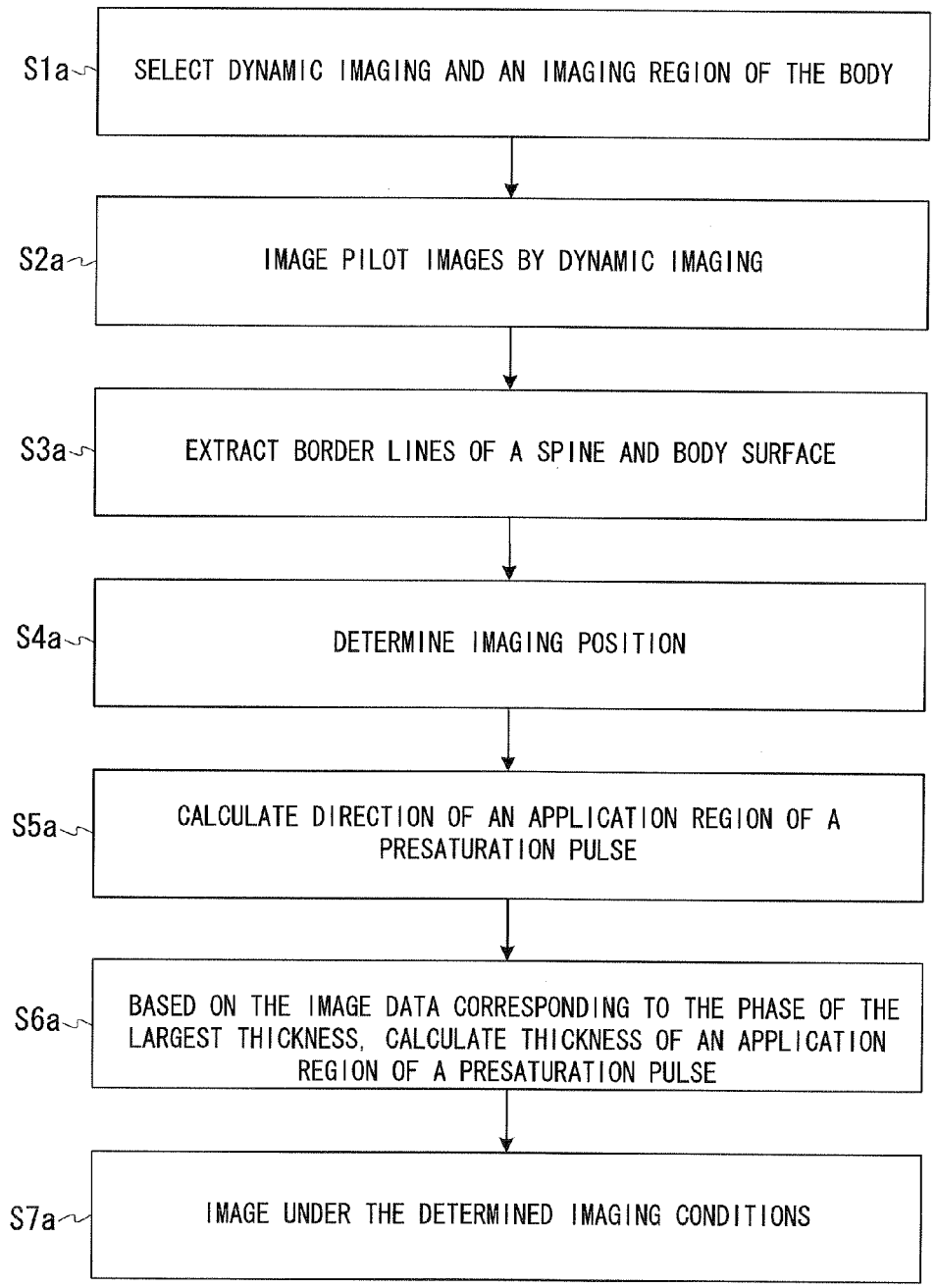
FIG. 10 is a flowchart illustrating an operation of the MRI apparatus 20 according to the second embodiment.

FIG. 10 is a flowchart illustrating an operation of the MRI apparatus 20 according to the second embodiment. In the following, an operation of the MRI apparatus 20 according to the second embodiment will be described with reference to the flowchart of FIG. 10, mainly focused on differences from the first embodiment.

[Step S1a]

The operator specifies imaging of an intervertebral disk of a spine as an imaging target and specifies dynamic imaging to detect a position change of the body surface due to a motion of the abdomen via the input device 62 (see FIG. 2).

[Step S2a]

When the operator instructs to start imaging via the input device 62, the MRI apparatus 20 takes pilot images by dynamic imaging. Then, the image reconstructing unit 90 generates image data for the pilot images for a plurality of time phases and inputs the image data to the image processing unit 92. The image processing unit 92 temporarily stores the image data processed in the storage device 66.

[Step S3a]

The image processing unit 92 acquires the image data for the MR images at different time phases from the storage device 66 and extracts the positions of the boundaries of the spine and the body surface based on the image data in the same procedure as in Step S3 in the first embodiment.

The image processing unit 92 stores the boundary information for the spine and the body surface extracted and inputs the boundary information to the imaging condition setting unit 84. In addition, the image processing unit 92 performs a processing of sorting out between vertebras and intervertebral disks in the same procedure as in the first embodiment, stores the boundary information for the vertebras and the intervertebral disks and inputs the boundary information to the imaging condition setting unit 84.

[Step S4a]

The imaging condition setting unit 84 performs positioning for the main scan imaging as in Step S4 in the first embodiment.

[Step S5a]

In order to determine the direction of the presaturation pulse application region, the imaging condition setting unit 84 calculates a straight line 130, which is a linear approximation of the ventral spine boundary 124 in the sagittal cross-sectional image, as in Step S5 in the first embodiment (see FIG. 7).

The calculation of the straight line 130 that is a linear approximation of the ventral spine boundary 124 may be performed for the image data for the images at all the different time phases or may be performed only for the image data for the image at some of the time phases. This is because a respiratory motion artifact of the abdomen is less likely to cause a significant movement of the spine.

[Step S6a]

The imaging condition setting unit 84 repeatedly performs the same processing as in Step S6 in the first embodiment for the image data at the different time phases, thereby calculating the distance between the straight lines 136 and 138, which corresponds to the thickness of the presaturation pulse application region, for the image data at each time phase (see FIG. 9).

Then, the imaging condition setting unit 84 selects image data at a time phase for which the distance between the straight lines 136 and 138 (the thickness of the presaturation pulse application region) is at a maximum (in FIG. 9, a time phase including the time t1).

Then, the imaging condition setting unit 84 provisionally determines the region between the straight lines 136 and 138 calculated for the selected image data as the presaturation pulse application region, and stores the application region as an imaging condition in the condition storage unit 82.

The presaturation pulse application region automatically calculated in this way is displayed on the display device 64 under the control of the display control unit 88 (as shown in the left diagram in FIG. 9, for example).

Then, the operator can modify (adjust) the direction or width of the displayed presaturation pulse application region via the input device 62 as required. If the operator does not perform any input operation for the presaturation pulse application region, the imaging condition setting unit 84 determines the application region automatically calculated (provisionally determined) as described above as a definitive presaturation pulse application region.

The presaturation pulse application region automatically calculated as described above may be automatically determined as a definitive application region without displaying the automatically determined application region to allow the operator to confirm the application region.

[Step S7a]

Imaging is performed under the imaging conditions finally determined as described as in Step S7 in the first embodiment.

The foregoing is a description of an operation according to the second embodiment. The second embodiment also provides the same advantages as the first embodiment.

In addition, according to the second embodiment, the straight lines 136 and 138, which correspond to edges of the presaturation pulse application region, are calculated for the image data at different time phases acquired in dynamic imaging. And the region between the straight lines 136 and 138 for the image data at a time phase for which the distance between the straight lines 136 and 138 is at a maximum is provisionally determined as the presaturation pulse application region and displayed. Therefore, the presaturation pulse application region is automatically calculated based on the image data at a time phase in which the abdomen swells most (that is, an inhalation phase), and therefore, a respiratory motion artifact of the abdomen can be suppressed with reliability.

Third Embodiment

Figure 11:
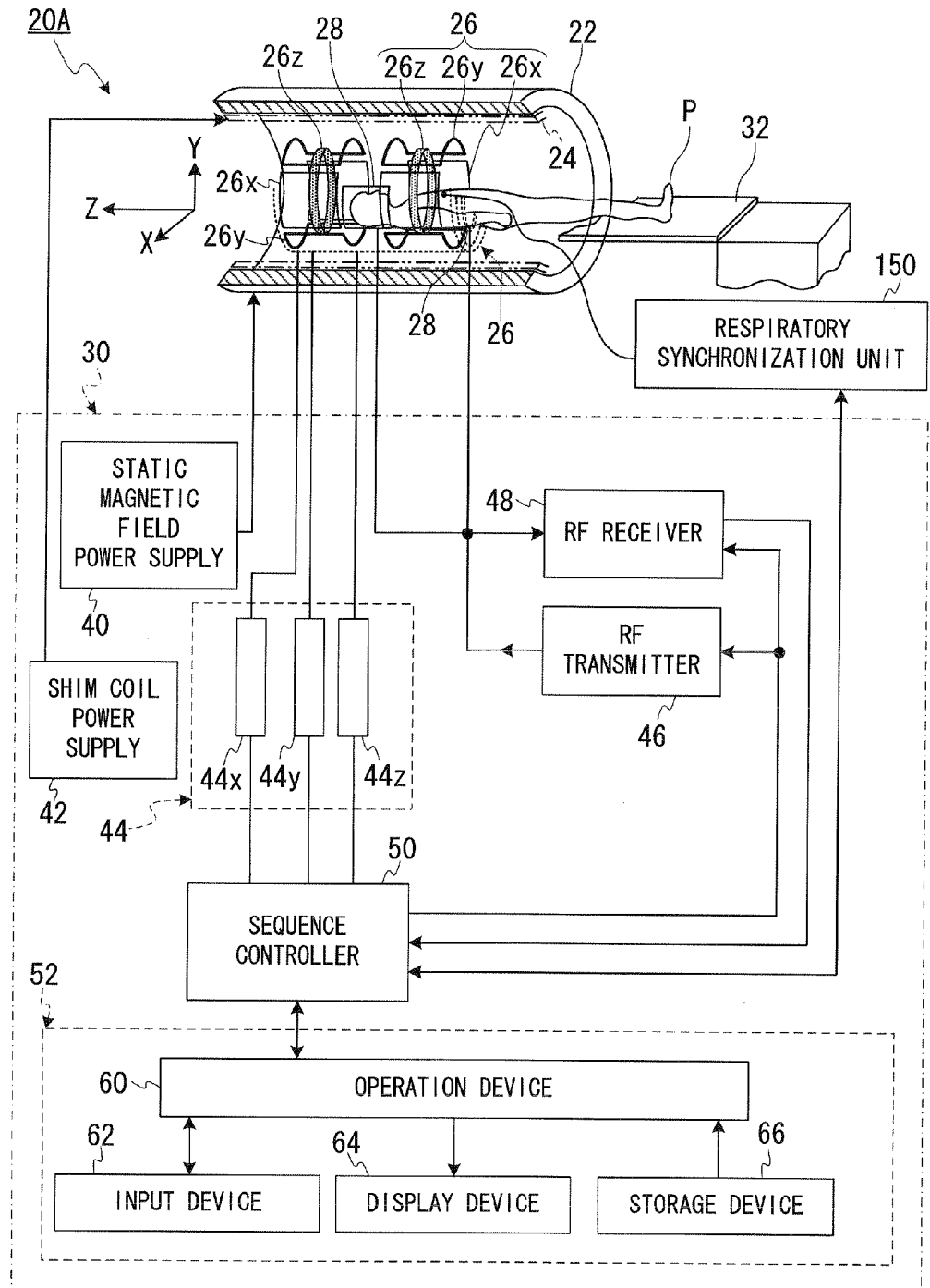
FIG. 11 is a block diagram showing an MRI apparatus according to the third embodiment.

FIG. 11 is a block diagram showing a configuration of the whole of an MRI apparatus 20A according to a third embodiment. The third embodiment differs from the first embodiment in that a respiratory synchronization unit 150 is additionally provided.

The respiratory synchronization unit 150 is provided with a respiration sensor (an electrode) that is in contact with a chest of the object P and detects a signal proportional to a motion of a thorax. The respiratory synchronization unit 150 calculates respiratory curve data from the signal detected by the respiratory sensor to generate a respiratory synchronization signal that is in synchronization with a desired period in a respiratory cycle of the object P (an inhalation period, for example). And the respiratory synchronization unit 150 inputs the respiratory synchronization signal to the sequence controller 50.

As an alternative to providing the respiratory synchronization unit 150, a frequency encoding gradient magnetic pulse for collecting projection data for determining a respiratory position of the object P may be applied to detect the respiratory cycle.

More specifically, a time sequence of a plurality of projection data are Fourier-transformed in a read-out direction, thereby creating a plurality of projection data in a real space that represents a respiratory motion. Then, referring to the projection data, the amount of respiratory motion of an imaging region such as a heart of the object P at a time when each of projection data is collected can be determined in the form of an amount of relative movement of the imaging region with respect to a reference position.

The amount of relative movement of the imaging region with respect to the reference position can be determined by finding a correlation between the projection data for the reference position and the projection data for which the amount of relative movement is to be determined, thereby determining the amount of relative position shift.

Alternatively, a movement of an abdominal muscle may be detected as an optical variable to detect the respiratory cycle.

As an alternative to providing respiratory synchronization unit 150, a real-time motion correction (RMC) method may be used to detect the respiratory cycle. The RMC is a technique for correcting a motion of the object that causes an artifact in real time.

In RMC, for example, a motion probing pulse (MPP) is collected using electrocardiogram (ECG) synchronization. Then, the acquisition region of imaging data or the acquired imaging data are corrected in real time in such a manner that an effect of a respiratory motion is removed with the amount of motion measured based on the MPP.

The MPP is acquired from a region including a diaphragm, for example, in a phase encoding amount smaller than the phase encoding amount for the imaging data or without applying a phase encoding gradient magnetic field.

In that case, the position of the diaphragm in a body axis direction at the time of acquisition of the MPP can be detected as a respiratory level from the signal obtained by performing a one-dimensional Fourier transform on the MPP. Since the diaphragm lowers toward the feed in the body axis direction during inhalation and rises toward the head in the body axis direction during exhalation, the inhalation phase and the exhalation phase can be detected. Therefore, imaging can be performed at the timing corresponding to a desired inhalation phase.

Then, the amount of deviation of the respiratory level from the reference value can be determined as the amount of respiratory motion. Furthermore, the data acquisition region is displaced by an amount corresponding to the amount of respiratory motion. In this way, the effect of the respiratory motion can be reduced.

The flow of the operation of the MRI apparatus 20A according to the third embodiment is basically the same as the flow in the first embodiment described above with reference to FIG. 8, but differs from the flow in the first embodiment in the following three points.

First, in Step S1, respiratory synchronization is also specified as an imaging condition.

Second, in Step S2, a respiratory synchronization signal is inputted from the respiratory synchronization unit 150 to the sequence controller 50 before taking the pilot images. The MPU acquires the respiratory synchronization signal from the sequence controller 50, and a pilot image at an inhalation phase is taken based on the respiratory synchronization signal.

Third, in Step S3, the boundaries of the spine and the body surface are extracted based on the image data for the pilot image at the inhalation phase, and in Steps S5 and S6, the presaturation pulse application region is automatically calculated and determined based on the image data for the pilot image at the inhalation phase.

The third embodiment described above provides the same advantages as the first and second embodiments. In addition, according to the third embodiment, since the respiratory synchronization signal is used, image data at the inhalation phase can be acquired without taking a plurality of images at different time phases. Therefore, the number of slices of pilot images, which are used for determining the presaturation pulse application region based on the image data at the inhalation phase in order to reliably suppress the respiratory motion artifact of the abdomen, can be minimized.

Fourth Embodiment

A fourth embodiment involves automatically calculating two prepulse application regions, one of which is an IR pulse application region, and the other is an application region of a presaturation pulse. As an example, imaging of a renal artery will be described. The configuration of an MRI apparatus according to the fourth embodiment is the same as the configuration of the MRI apparatus 20 according to the first embodiment shown in FIGS. 1 and 2. Therefore, the diagram showing the configuration of the apparatus is omitted, and the MRI apparatus according to the fourth embodiment is denoted by the same reference numeral 20 as in the first embodiment.

Figure 12:
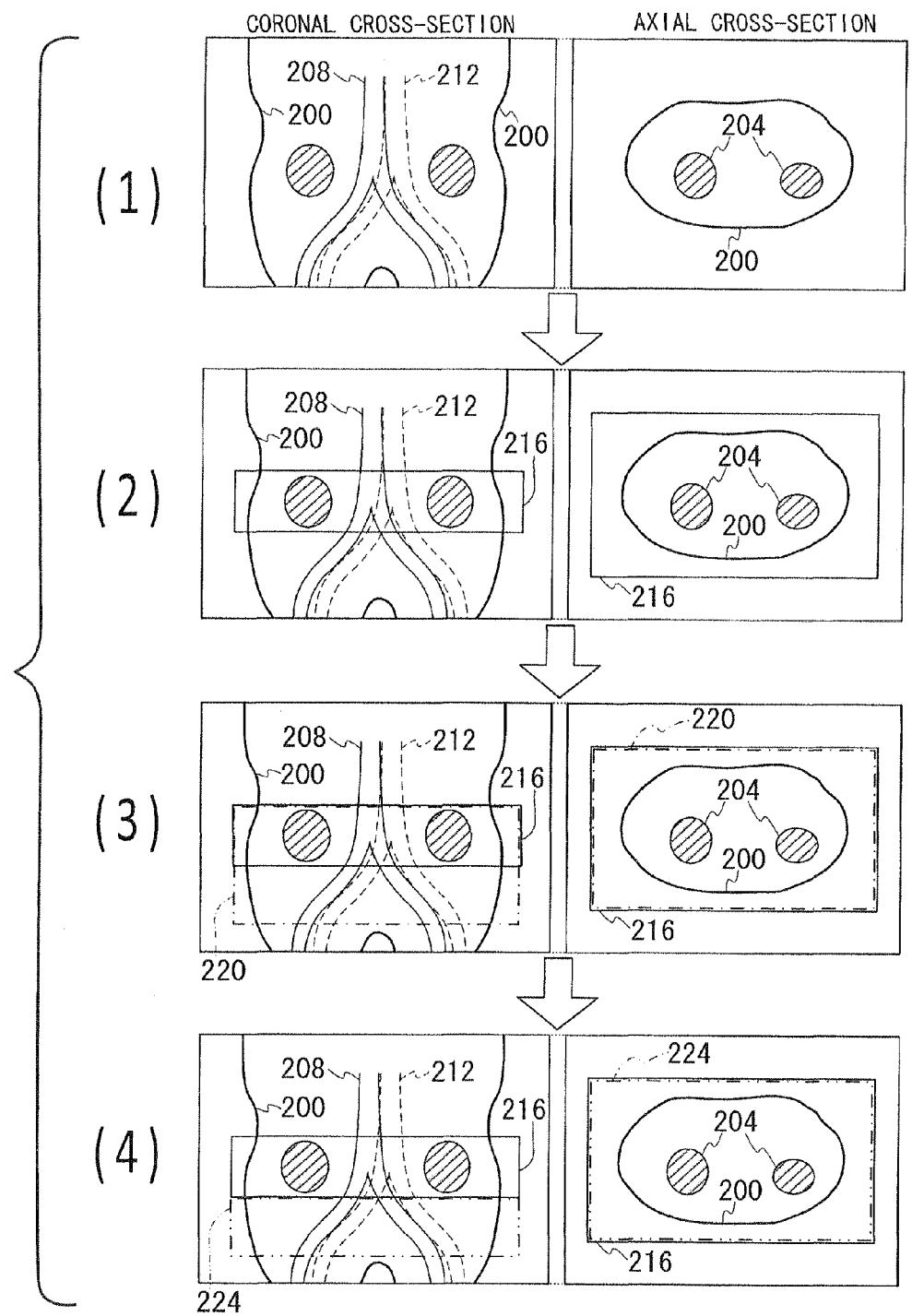
FIGS. 12, (1)-(4), are diagrams showing images associated with various steps of the operations shown in FIG. 13.

FIG. 12 includes schematic diagrams for illustrating a process of calculating an IR pulse application region and a presaturation pulse application region, which are assigned numbers (1) to (4) according to the time sequence in the calculation process. In each diagram, the left part shows a coronal cross-sectional image, and the right part shows an axial cross-sectional image.

More specifically, FIG. 12 (1) shows cross-sectional images after a kidney region is extracted.

FIG. 12 (2) shows cross-sectional images after imaging positioning.

FIG. 12 (3) shows cross-sectional images after an IR pulse application region 220 is calculated.

FIG. 12 (4) shows cross-sectional images after a presaturation pulse application region 224 is calculated. In FIGS. 12 (1) to 12 (4), a bold solid line represents a body surface boundary 200, a hatched area represents a kidney region 204, a solid line represents a renal artery 208, a dotted line represents a vein 212, a rectangular frame indicated by a solid line represents an imaging region (a region of interest) 216, a rectangular frame indicated by an alternate long and short dash line represents the IR pulse application region 220, and a rectangular frame indicated by an alternate long and two short dashes line represents the presaturation pulse application region 224.

Figure 13:
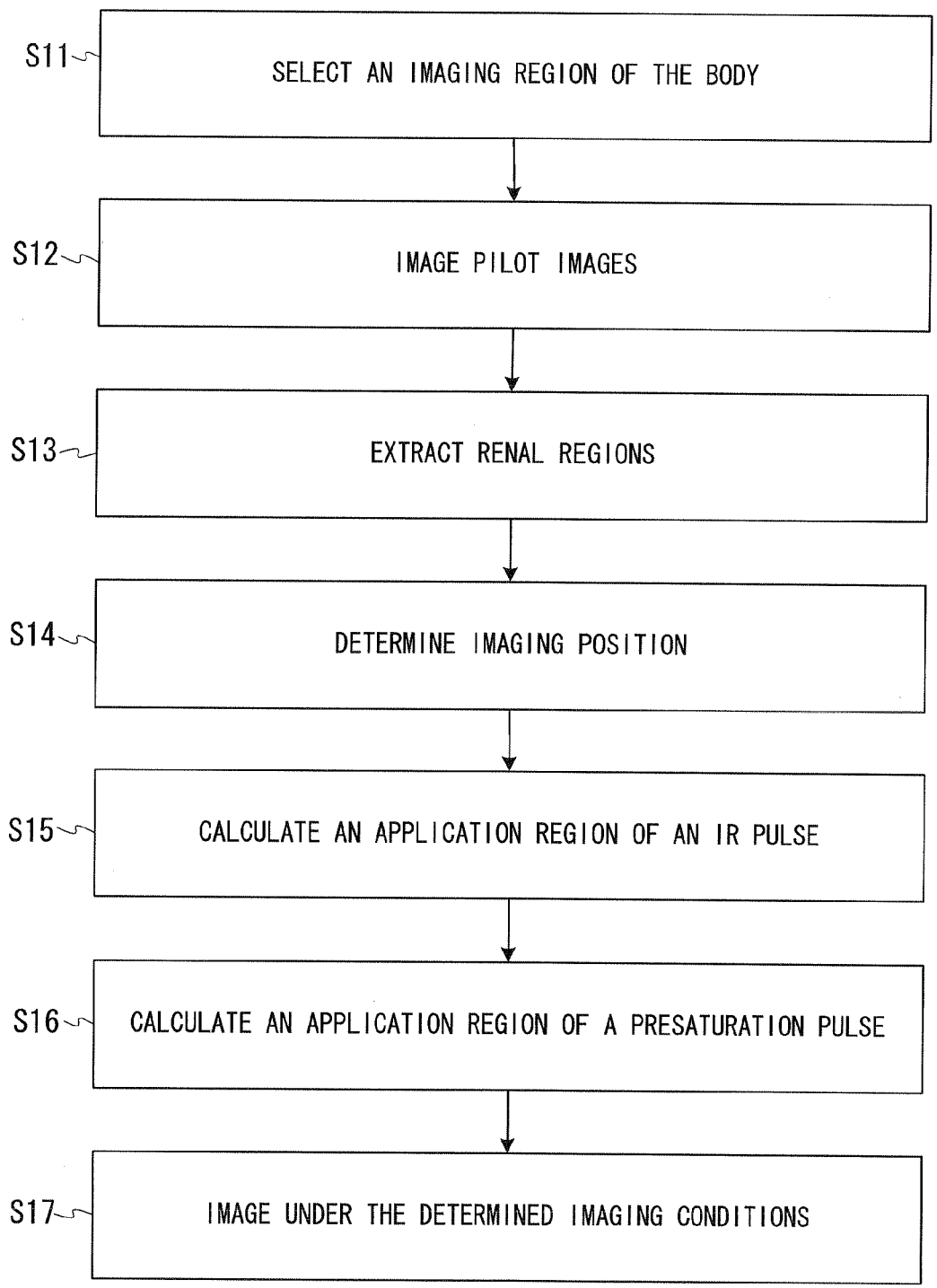
FIG. 13 is a flowchart illustrating an operation of the MRI apparatus 20 according to the third embodiment.

FIG. 13 is a flowchart illustrating an operation of the MRI apparatus 20 according to the fourth embodiment. In the following, an operation of the MRI apparatus 20 will be described with reference to the flowchart of FIG. 13 and FIG. 12.

[Step S11]

The operator specifies renal artery as an imaging target via input device 62. The imaging condition setting unit 84 stores an imaging condition renal artery in condition storage unit 82, acquires imaging conditions previously used for imaging of the renal artery from condition storage unit 82, and inputs the acquired imaging conditions to the display control unit 88.

The display control unit 88 makes the display device 64 display an example of the imaging conditions previously used for imaging of the renal artery. The operator can edit the imaging condition referring to the display content. However, if no input occurs, the imaging condition setting unit 84 makes settings to take coronal cross-sectional images and axial cross-sectional images as pilot images.

[Step S12]

When the operator instructs to start imaging via the input device 62, the MRI apparatus 20 takes pilot images, and the image reconstructing unit generates image data for the pilot images and inputs the image data to the image processing unit 92.

The image processing unit 92 performs predetermined image processing on the inputted image data under the image processing conditions stored in condition storage unit 82 and stores the processed image data in the storage device 66.

The image processing unit 92 acquires image data for the pilot images from storage device 66 and extracts positions of boundaries of a kidney and a body surface based on the image data (see FIG. 12(1)).

The kidney region can be extracted using prior-art image processing, such as template matching for extracting an organ region that agrees with the taken image based on statistical information on a human body model representing the shape and the size of each organ, such as kidneys and lungs, and a positional relationship between the organs. The image processing unit 92 stores the extracted boundary information for the kidney and the body surface and inputs the boundary information to imaging condition setting unit 84.

[Step S14]

The imaging condition setting unit 84 performs positioning of the main scan imaging region 216.

More specifically, the imaging region 216 in the axial cross section of the renal artery 208 is positioned so that the FOV is perpendicular to the pilot image of the coronal cross section (see the right part of FIG. 12 (2)).

For the imaging region 216 in the coronal cross section, a margin set as an image processing condition is added to the FOV. This is so that the FOV is set to cover the kidney region 204 extracted from the coronal cross-sectional image (see the left part of FIG. 12 (2)).

The phase encoding direction of the axial cross-sectional image of the renal artery is set to be an anterior direction (a direction from the dorsal side to the ventral side) of the object P.

The imaging condition settings described above are stored in condition storage unit 82 and displayed on display device 64 under control of display control unit 88. The operator can also manually adjust the imaging condition settings via input device 62 as required.

[Step S15]

In step S15, the IR pulse application region 220 is automatically calculated, and in Step S16, the presaturation pulse application region 224 is automatically calculated. In this example, since the renal artery 208 is to be imaged, MR signals for blood flowing into the imaging region 216 through the vein 212 from below (from the side of the feet) in the coronal cross-sectional image on the left of FIG. 12(2) are desirably suppressed so that blood flowing in the renal artery 208 in the imaging region 216 can be effectively depicted.

To this end, an IR pulse is applied to the entire imaging region 216 and a region below the imaging region 216, thereby inverting, by 180 degrees, a longitudinal magnetization component of both nuclear spins of blood flowing in renal artery 208 in imaging region 216 and nuclear spins of blood flowing into imaging region 216 from below through vein 212.

At a time different from the time of application of the IR pulse, a presaturation pulse (that causes inclination of a longitudinal magnetization component of nuclear spins by 90 degrees) is applied to a region below the lower edge of imaging region 216. The presaturation pulse results in saturation of nuclear spins of blood flowing into imaging region 216 from below through vein 212 (that is, makes longitudinal magnetization of the nuclear spins approximately equal to 0), and the MR signal therefor is selectively suppressed. As a result, blood flowing in renal artery 208 in imaging region 216 can be selectively depicted.

Thus, in Step S15, the imaging condition setting unit 84 sets the thickness direction of the IR pulse application region 220 to be the same as the axial direction (the direction perpendicular to the sheet of FIG. 12 (3) in the coronal cross-sectional image on the left of FIG. 12 (3)) so as to agree with the direction of the imaging region 216 determined in Step S14.

In addition, imaging condition setting unit 84 makes settings so that an upper edge of IR pulse application region 220 in the coronal cross section agrees with an upper edge of imaging region 216 and IR pulse application region 220 is twice as thick as imaging region 216, for example, (see the left part of FIG. 12 (3)).

The reason for twice is that it is empirically found that the width of IR pulse application region 220 enough to suppress MR signal for blood flowing into the imaging region from below through vein 212 is about twice or more the thickness of imaging region 216, but this embodiment is not limited to such a value.

The thickness of IR pulse application region 220 can be appropriately set by imaging condition setting unit 84 from the viewpoint of the desired degree of suppression of the MR signal for blood flowing into imaging region 216 from below through vein 212.

In addition, imaging condition setting unit 84 calculates IR pulse application region 220 so that IR pulse application region 220 includes the region of interest in the axial cross section. In this example, imaging condition setting unit 84 sets IR pulse application region 220 to agree with imaging region 216 in the axial cross section (in the axial cross-sectional image on the right of FIG. 12 (3), the IR pulse application region 220 represented by the alternate long and short dash line is slightly inwardly displaced from imaging region 216 represented by the solid-line frame in order to avoid overlap of lines representing the regions).

The imaging condition setting unit 84 stores IR pulse application region 220 calculated as described above in condition storage unit 82 as an imaging condition. The IR pulse application region 220 provisionally determined in this way is displayed on display device 64 under control of display control unit 88 as shown in FIG. 12 (3), for example.

The operator can modify (adjust) displayed IR pulse application region 220 via input device 62 as required. If the operator does not perform any input operation for IR pulse application region 220, imaging condition setting unit 84 determines the application region automatically calculated (provisionally determined) as described above as a definitive IR pulse application region 220.

Note that the IR pulse application region 220 automatically calculated as described above may be automatically determined as a definitive application region without displaying the automatically determined application region to allow the operator to confirm the application region.

[Step S16]

The imaging condition setting unit 84 sets the thickness direction of presaturation pulse application region 224 to be the same as the thickness direction of IR pulse application region 220.

In addition, imaging condition setting unit 84 sets the thickness of presaturation pulse application region 224 as follows. That is, an upper edge of presaturation pulse application region 224 in the coronal cross section agrees with a lower edge of imaging region 216, and a lower edge of presaturation pulse application region 224 agrees with a lower edge of IR pulse application region 220 (see the coronal cross-sectional image on the left of FIG. 12 (4)).

As an example, according to this embodiment, the combined region of imaging region 216 and presaturation pulse application region 224 adjacent to each other in the coronal cross section is equal to IR pulse application region 220.

In addition, imaging condition setting unit 84 provisionally determines presaturation pulse application region 224 so that presaturation pulse application region 224 includes the region of interest in the axial cross section. In this example, imaging condition setting unit 84 sets presaturation pulse application region 224 to agree with imaging region 216 in the axial cross section (in the axial cross-sectional image on the right of FIG. 12 (4), presaturation pulse application region 224 represented by the alternate long and two short dashes line is slightly inwardly displaced from imaging region 216 represented by the solid-line frame in order to avoid overlap of lines representing the regions).

The imaging condition setting unit 84 stores presaturation pulse application region 224 set as described above in condition storage unit 82 as an imaging condition. The presaturation pulse application region 224, automatically calculated (provisionally determined) in this way, is displayed on display device 64 under control of display control unit 88 as shown in FIG. 12(4), for example.

The operator can modify (adjust) displayed presaturation pulse application region 224 via input device 62 as required. If the operator does not perform any input operation for presaturation pulse application region 224, imaging condition setting unit 84 determines the application region automatically calculated (provisionally determined) as described above as a definitive presaturation pulse application region 224.

Note that presaturation pulse application region 224, automatically calculated as described above, may be automatically determined as a definitive application region without displaying the automatically determined application region to allow the operator to confirm the application region.

[Step S17]

Imaging is performed under the imaging conditions determined as described above. More specifically, an IR pulse and a presaturation pulse are applied to the regions (220 and 224) determined as described above at different times. Then, RF pulses or the like for acquiring image data are applied.

Then, image data for the MR images of imaging region 216 for renal artery 208 are generated and stored in storage device 66. The image data are also displayed on display device 64 as images under control of display control unit 88.

As described above, according to the fourth embodiment, MRI apparatus 20 automatically calculates IR pulse application region 220 in addition to presaturation pulse application region 224. Therefore, the burden of setting imaging conditions on the operator is significantly reduced. As a result, the throughput of examination using MRI apparatus 20 can be significantly improved.

According to the embodiments described above in detail, imaging conditions concerning a prepulse in MRI can be set more easily than conventional art.

Supplementary Note on Embodiments

[1] In the first to fourth embodiments described above, in the process of automatically calculating the application regions for the presaturation pulse and the IR pulse, a pilot image is used, for example. However, embodiments of the present invention are not limited to such an aspect. As an alternative, an MR image obtained in another imaging sequence performed before calculation and determination of the presaturation pulse application region or the IR pulse application region may be used to determine the application regions.

[2] In the examples described above, the method of automatically determining a prepulse application region according to the present invention is applied to imaging of a spine region or a renal artery. However, embodiments of the present invention are not limited to such an aspect. Embodiments of the present invention can be applied to a case where another region, such as a heart, is imaged.

For example, a case of imaging of a heart will be described. The heart shrinks in a time phase in which the heart pumps out blood and expands in a time phase in which blood flows into a ventricle. Thus, an electrocardiogram (ECG) unit that acquires an ECG signal representing heart beat information for the object P may be provided to detect a time phase in which the heart expands most, a heart region may be depicted based on image data for the time phase, and the prepulse application region may be automatically determined so as to suppress a flow artifact in the heart and a great vessel.

Alternatively, depending on the imaging target, the prepulse application region may be automatically determined by extracting a heart region based on image data for a time phase in which the heart shrinks most.

[3] The present invention can be applied to automatic determination of an application region for a region-selective IR pulse or a region-nonselective IR pulse in a time spatial labeling inversion pulse (t-SLIP) method, for example.

Here, the t-SLIP (Time-SLIP: Time Spatial Labeling Inversion Pulse) method is one for labeling blood, and uses a plurality of labeling pulses. In a pulse sequence of the t-SLIP method, an ASL (arterial spin labeling) pulse is applied for labeling blood flowing into an imaging region. Then, the labeled blood which has reached the imaging region is selectively depicted by performing data acquisition of MR signals after TI (inversion time).

A pulse sequence of the t-SLIP method includes at least a region selective IR pulse. In a pulse sequence of the t-SLIP method, a region non-selective inversion pulse can be switched on/off. That is there are two cases for a pulse sequence of the t-SLIP method. In one case, a pulse sequence of the t-SLIP sequence consists of the region selective IR pulse(s) only. In the other case, a pulse sequence of the t-SLIP method includes both the region non-selective IR pulse(s) and the region selective IR pulse(s).

[4] In the second and third embodiments described above, the presaturation pulse application region is determined based on the image data obtained in imaging in the inhalation phase, for example. However, embodiments of the present invention are not limited to such an aspect. Depending on the location of the region of interest or the imaging target, the presaturation pulse application region may be determined based on the image data obtained in imaging in the exhalation phase.

[5] Correspondences between terms used in the claims and terms used in the embodiment described above will be described. Note that the correspondences described below are just some of possible interpretations for reference and should not be construed as limiting the present invention.

A configuration that includes a static magnetic field magnet 22, a shim coil 24, a gradient coil 26, an RF coil 28 and a control system 30 (see FIG. 1) and generates image data for an MR image of an object P by imaging that involves application of a prepulse, a gradient magnetic field and an RF pulse is an example of an imaging unit described in the claims.

The image processing unit 92 that extracts the ventral body surface boundary 120, the ventral spine boundary 124 and the like (see FIG. 2) and the imaging condition setting unit 84 that determines the presaturation pulse application region or the IR pulse application region based on the result of extraction by the image processing unit 92 are an example of an application region calculating unit described in the claims.

The straight lines 130 and 136 in the first embodiment (see FIGS. 7 (2) and 7 (4)) are an example of a first straight line and an example of a second straight line described in the claims, respectively.

The straight lines 134 and 138 in the first embodiment (see FIGS. 7 (3) and 7 (4)) are an example of a third straight line and an example of a fourth straight line described in the claims, respectively.

The ventral body surface boundary 120 is an example of a tissue region described in the claims. The term tissue region generically means regions of tissues of a human body, such as a body surface, a bone, a vessel and an organ.

The functions of the display control unit 88 and the display device 64 that display the presaturation pulse application region or the IR pulse application region automatically calculated by the imaging condition setting unit 84 are an example of a display unit described in the claims.

[6] While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic resonance (MR) imaging apparatus, comprising:
    an application region calculating unit configured to automatically calculate a prepulse application region based on previously acquired MR pilot image data including a region of interest of an object, said automatically calculated prepulse application region having position, thickness and prepulse direction parameters which vary as a function of the region of interest; and
    an MR imaging unit configured to perform diagnostic magnetic resonance imaging (MRI) of the region of interest of the object including application of the automatically calculated prepulse in a diagnostic MRI data acquisition sequence.

2. The magnetic resonance imaging apparatus according to claim 1, further comprising:
    a display unit configured to display the automatically calculated prepulse application region.

3. The magnetic resonance imaging apparatus according to claim 1,
    wherein the application region calculating unit is configured to determine the automatically calculated prepulse application region.

4. The magnetic resonance imaging apparatus according to claim 3,
    wherein the imaging unit is configured to apply as the prepulse at least one of: (a) an inversion recovery pulse and (b) a spatially-selective presaturation pulse for saturating nuclear spins.

5. A magnetic resonance (MR) imaging apparatus comprising:
    an imaging unit configured to perform MR imaging of an object including application of a prepulse; and
    an application region calculating unit configured to automatically calculate an application region of the prepulse according to a region of interest of the MR imaging based on image data including the region of interest that are acquired before the application of the prepulse;
    wherein the application region calculating unit is configured to determine the automatically calculated application region of the prepulse as an application region of the prepulse; and
    wherein the application region calculating unit is configured to extract a first tissue region and a second tissue region based on previously acquired MR image data including the region of interest and to automatically calculate the prepulse application region according to the first and second tissue regions and the region of interest.

6. The magnetic resonance imaging apparatus according to claim 5,
    wherein, in a case where a presaturation pulse for saturating a nuclear spin is applied as the prepulse, the application region calculating unit is configured to extract a spine region as the first tissue region and a body surface on a ventral side as the second tissue region based on the image data including the spine region as the region of interest.

7. A magnetic resonance (MR) imaging apparatus comprising:
    an imaging unit configured to perform MR imaging of an object including application of a prepulse; and
    an application region calculating unit configured to automatically calculate an application region of the prepulse according to a region of interest of the MR imaging based on image data including the region of interest that are acquired before the application of the prepulse;
    wherein the application region calculating unit is configured to determine the automatically calculated application region of the prepulse as an application region of the prepulse; and
    wherein, in a case where a presaturation pulse for saturating nuclear spins is applied as the prepulse, the application region calculating unit is configured to: (a) extract a spine region based on the image data including the spine region as the region of interest, (b) calculate a first straight line that is a linear approximation of the spine region, (c) calculate a second straight line that is translated from the first straight line by a predetermined distance toward a ventral side as far as the second straight line does not reach a body surface on the ventral side, and (d) calculate at least a part of a region on the ventral side of the second straight line as the prepulse application region.

8. The magnetic resonance imaging apparatus according to claim 7,
wherein, in the case where the presaturation pulse is applied as the prepulse, the application region calculating unit is configured to: (a) also extract a body surface boundary on the ventral side based on the image data including the spine region as the region of interest, (b) calculate a third straight line that is parallel to the first straight line and is tangent to the body surface boundary on the ventral side from outside an abdomen, (c) calculate a fourth straight line that is translated from the third straight line outwardly from the abdomen by a predetermined distance, and (d) calculate a region between the second straight line and the fourth straight line as the prepulse application region.

9. A magnetic resonance (MR) imaging apparatus comprising:
an imaging unit configured to perform MR imaging of an object including application of a prepulse; and
an application region calculating unit configured to automatically calculate an application region of the prepulse according to a region of interest of the MR imaging based on image data including the region of interest that are acquired before the application of the prepulse;
wherein the application region calculating unit is configured to determine the automatically calculated application region of the prepulse as an application region of the prepulse; and
wherein the application region calculating unit is configured to calculate the prepulse application region according to the region of interest based on a plurality of image data including the region of interest that are acquired at different respiratory phases by magnetic resonance imaging before application of the prepulse.

10. The magnetic resonance imaging apparatus according to claim 9,
wherein the application region calculating unit is configured to: (a) extract a tissue region based on the plurality of image data, and (b) calculate the prepulse application region according to the tissue region and the region of interest.

11. The magnetic resonance imaging apparatus according to claim 10,
wherein the application region calculating unit is configured to extract a body surface of a ventral side as the tissue region.

12. A magnetic resonance (MR) imaging apparatus comprising:
an imaging unit configured to perform MR imaging of an object including application of a prepulse; and
an application region calculating unit configured to automatically calculate an application region of the prepulse according to a region of interest of the MR imaging based on image data including the region of interest that are acquired before the application of the prepulse;
wherein the application region calculating unit is configured to determine the automatically calculated application region of the prepulse as an application region of the prepulse; and
wherein the application region calculating unit is configured to calculate the prepulse application region according to the region of interest based on the image data including the region of interest acquired at a desired respiratory phase in respiratory synchronization by magnetic resonance imaging before application of the prepulse.

13. The magnetic resonance imaging apparatus according to claim 12,
wherein the application region calculating unit is configured to: (a) extract a tissue region based on the image data including the region of interest, and (b) calculate the prepulse application region according to the tissue region and the region of interest.

14. The magnetic resonance imaging apparatus according to claim 13,
wherein the application region calculating unit is configured to extract a body surface of a ventral side as the tissue region.

15. A magnetic resonance (MR) imaging apparatus comprising:
an imaging unit configured to perform MR imaging of an object including application of a prepulse; and
an application region calculating unit configured to automatically calculate an application region of the prepulse according to a region of interest of the MR imaging based on image data including the region of interest that are acquired before the application of the prepulse;
wherein the application region calculating unit is configured to determine the automatically calculated application region of the prepulse as an application region of the prepulse; and
wherein the imaging unit is configured to apply as the prepulse an inversion recovery pulse and a spatially-selective presaturation pulse for saturating nuclear spins, and
the application region calculating unit is configured to: (a) calculate a region adjacent to the region of interest as a presaturation pulse application region, and (b) calculate a region including the presaturation pulse application region and the region of interest as an inversion recovery pulse application region.

16. A magnetic resonance (MR) imaging method comprising:
automatically machine-calculating an MRI prepulse application region according to a region of interest of an object based on prior MR pilot image data including the region of interest that have been generated by magnetic resonance imaging, said automatically calculated prepulse application region having position, thickness and prepulse direction parameters which vary as a function of the region of interest; and
generating diagnostic MR image data by performing diagnostic magnetic resonance imaging of the object including application of the automatically calculated MRI prepulse.

* * * * *